United States Patent
Sheu et al.

(10) Patent No.: US 8,122,406 B2
(45) Date of Patent: Feb. 21, 2012

(54) GENERATING MODELS FOR INTEGRATED CIRCUITS WITH SENSITIVITY-BASED MINIMUM CHANGE TO EXISTING MODELS

(75) Inventors: Bing J. Sheu, Hsin-Chu (TW); Jiann-Tyng Tzeng, Hsin-Chu (TW); David B. Scott, Plano, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 603 days.

(21) Appl. No.: 12/259,050

(22) Filed: Oct. 27, 2008

(65) Prior Publication Data
US 2010/0106469 A1    Apr. 29, 2010

(51) Int. Cl.
*G06F 17/50* (2006.01)
(52) U.S. Cl. ........................... 716/110; 716/111
(58) Field of Classification Search .......... 716/106–109, 716/110–114
See application file for complete search history.

(56) References Cited

U.S. PATENT DOCUMENTS

| | | | | |
|---|---|---|---|---|
| 7,243,320 | B2* | 7/2007 | Chiu et al. | 716/106 |
| 7,251,806 | B2* | 7/2007 | Melvin, III | 716/52 |
| 7,310,792 | B2* | 12/2007 | Verghese et al. | 716/113 |

OTHER PUBLICATIONS

"PTM Introduction," (online) http://www.eas.asu.edu/~ptm/introduction.html, last updated Sep. 30, 2008, 2 pgs.

* cited by examiner

*Primary Examiner* — Jack Chiang
*Assistant Examiner* — Binh Tat
(74) *Attorney, Agent, or Firm* — Slater & Matsil, L.L.P.

(57) ABSTRACT

A method for generating model files of target devices of an integrated circuit includes providing the target devices; providing a device target set for the target devices, wherein the device target set comprises target values of parameters of the target devices; determining a nearest known model related to the target devices, wherein the nearest known model comprises a first model file; performing a sensitivity analysis to determine sensitive parameters in the first model file; modifying the sensitive parameters in the first model file to generate a second model file; and determining a fitness value of a circuit simulated using the second model file with values of parameters in the device target set.

20 Claims, 6 Drawing Sheets

GENERATING MODELS FOR INTEGRATED CIRCUITS WITH SENSITIVITY-BASED MINIMUM CHANGE TO EXISTING MODELS

TECHNICAL FIELD

This invention relates generally to the modeling of integrated circuits, and more particularly, to generating model files by making sensitivity-based minimum changes to existing models.

BACKGROUND

In the integrated circuit manufacturing industry, new generations of integrated circuits are constantly being developed. It is important to perform circuit simulation for future generations of integrated circuits, so that designers may make design decisions by simulating the performance of the designed circuits. Therefore, the models for new generations of integrated circuits need to be developed before the physical existence of the integrated circuits. This posts a challenge for the development of the models.

Currently, there are some organizations working on the modeling of integrated circuits. For example, University of California at Berkeley and Arizona State University developed a predictive technology model (PTM) method for providing predictive model files for future transistor and interconnect technologies. These predictive model files are compatible with standard circuit simulators, such as a simulation program with integrated circuit emphasis (SPICE), and scalable with a wide range of process variations. With the PTM method, competitive circuit design and research can be started even before the advanced semiconductor technology is fully developed.

The PTM model files, however, suffer from shortcomings. The PTM model files are focused on the trend of the development. Therefore, the PTM model files reflect the overall trend for multiple integrated circuit developing companies, and are relatively fixed. Each of the companies may have their own development directions, which although generally speaking will be reflected by the overall trench, will inevitably have discrepancies with the PTM model files. Therefore, the PTM model files cannot be used by the integrated circuit developing companies without going through further customization. Further, the PTM model files require comprehensive device information in order to be used. In the case only partial device information is available, the PTM model files cannot be successfully generated. Also, the PTM model files may not properly reflect the inherent physical relationship between the characteristics of an integrated circuit. Accordingly, a new method for developing the model files is needed.

SUMMARY OF THE INVENTION

In accordance with one aspect of the present invention, a method for generating model files of the target devices of an integrated circuit includes providing the target devices; providing a device target set for the target devices, wherein the device target set comprises target values of parameters of the target devices; determining a nearest known model related to the target devices, wherein the nearest known model comprises a first model file; performing a sensitivity analysis to determine sensitive parameters in the first model file; modifying the sensitive parameters in the first model file to generate a second model file; and determining a fitness value of a circuit simulated using the second model file with values of parameters in the device target set.

In accordance with another aspect of the present invention, a method for generating model files of devices for integrated circuits includes providing target transistors; providing a device target set for the target transistors, wherein the device target set comprises target parameter values; determining a list of candidate known models related to the target transistors; selecting a nearest known model from the list of candidate known models, wherein the nearest known model comprises a first model file; generating I-V curves and C-V curves from the nearest known model; warping the I-V curves and the C-V curves to generate warped I-V curves and warped C-V curves, fitting at least one of the target parameter values in the device target set; performing a sensitivity analysis to determine sensitive parameters in the first model file; modifying the sensitive parameters in the first model file to generate a second model file; simulating the performance of the target transistors using the second model file; and comparing the performance with the warped I-V curves and warped C-V curves to determine a fitness value.

The advantageous features of the present invention include well preserved device physics in the newly generated model files, and the ability of generating model files using partial device target set.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for developing model files is discussed herein. In the subsequent discussion, the development of transistor model files is discussed to explain the concept of the present invention. However, the concept of the present invention may be used in the development of devices other than transistors, and in the development of integrated circuits including more than one device, such as static random access memory (SRAM) cells.

Figure 1:
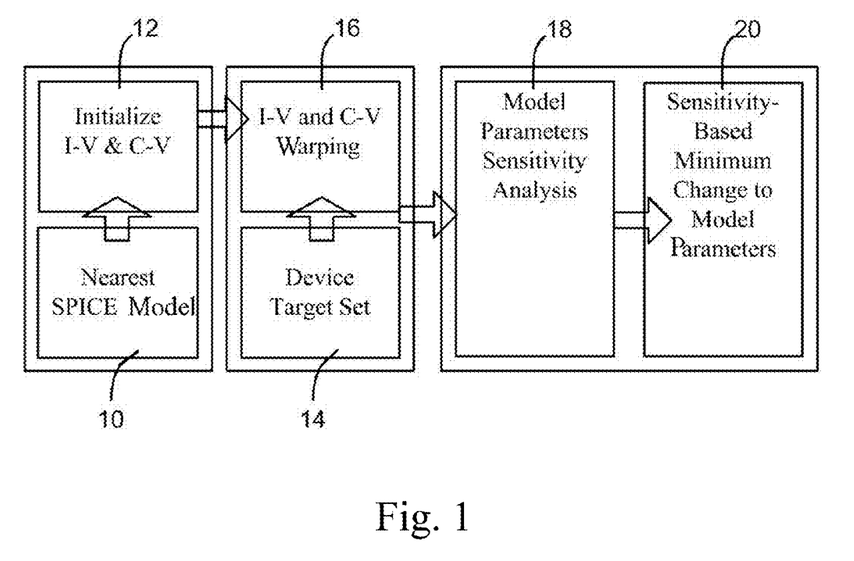
FIG. 1 illustrates a workflow of an embodiment of the present invention.

FIG. 1 illustrates a brief block diagram showing the workflow of an embodiment of the present invention. The function of each of the blocks is discussed in detail in subsequent paragraphs. In an initial step, a device (referred to as target device, or target transistor hereinafter) whose model files are to be developed is determined. The technology used for manufacturing the target device is also determined. In an exemplary embodiment of the present invention, the target device is a target transistor (not shown) comprising a gate, a source and a drain, and the target model files are assumed to be for 32/28 nm technology and/or for 22/20 nm technology.

A nearest known model (for example, in the form of one or a set of model files), which may most closely reflect the characteristics of the target device is then determined, as shown as block 10 in FIG. 1. Assuming currently there are a list of candidate known models including a model for a transistor formed using 40 nm technology, a model for a transistor formed using 45 nm technology, and a model for a transistor formed using 65 nm technology, the nearest known model will be 40 nm technology for the 32 nm case. Also, there may be existing models for different types of transistors, for example, planar transistors, FinFET transistors, transistors formed on bulk substrates, transistors formed on silicon-on-insulator (SOI) substrates, and the like. The nearest known model will also be selected to match the type of the target device, so that the nearest known model matches the target device as much as possible.

Currently, there are various model file formats, such as BSIM3, BSIM4, PSP, HiSIM, and the like. The nearest known model may be in any of these file formats. The respectively generated model files for the target device are preferably of the same format as that of the nearest known model. However, if the model files for the target device are desired to be of a format different from that of the nearest known model, the nearest known model files may be converted to the format desirable for the target device first, and then the target model files may be generated without making changes to the format, wherein the generation of target model files are discussed in subsequent paragraphs.

Figure 2A:
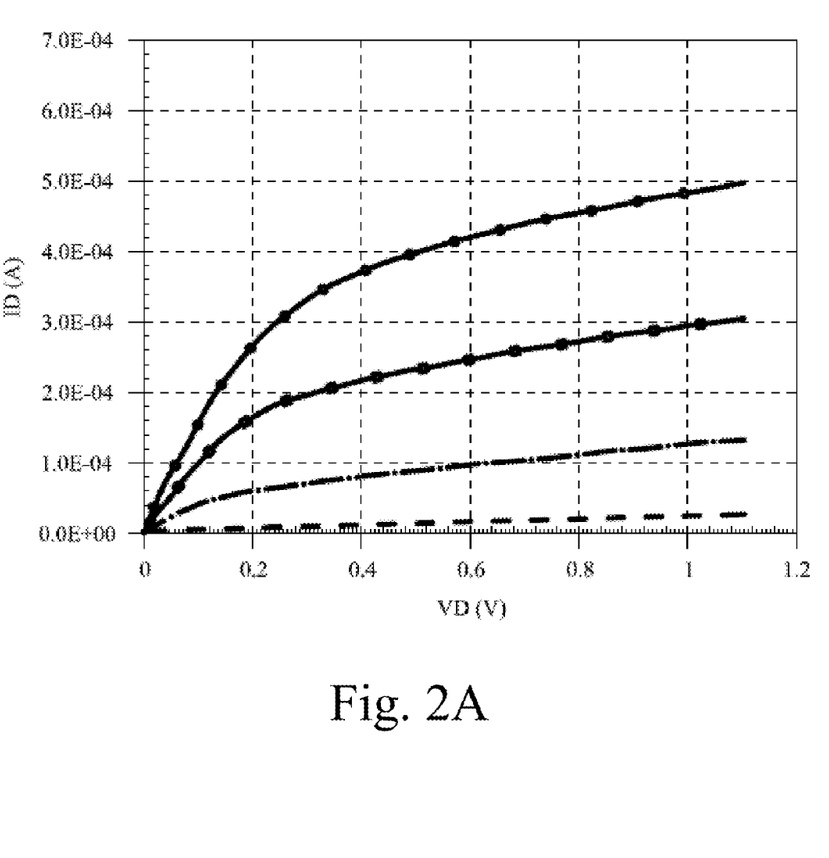
FIG. 2A illustrates I-V curves generated by the nearest known model of a target transistor.
Figure 2B:
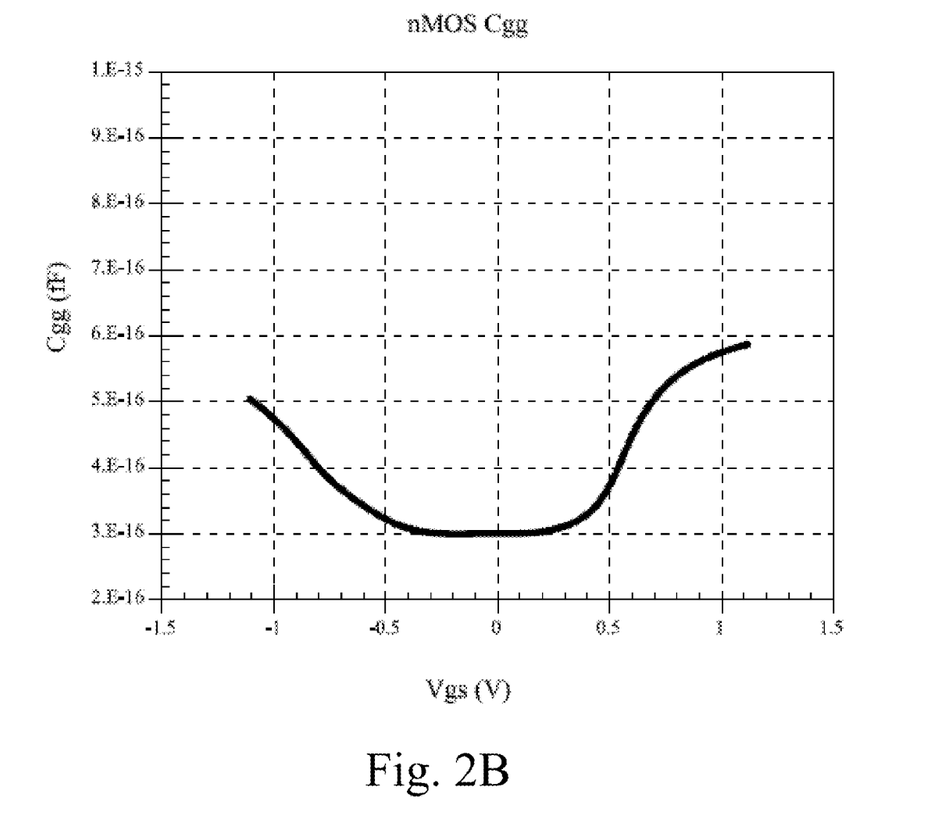
FIG. 2B illustrates C-V curves generated by the nearest known model of a target transistor.

Next, as shown by block 12 in FIG. 1, the static and dynamic characteristics of the nearest known model are generated. For example, FIG. 2A illustrates the static characteristics of the nearest known model in the form of I-V curves, while FIG. 2B illustrates the dynamic characteristics of the nearest known model in the form of C-V curves.

To form the device model files, the device target set needs to be determined (block 14 in FIG. 1), which specifies what is the expected performance of the target device, for example, formed using 32 nm technology. The device target set may be a comprehensive set including all the desirable target values of the target parameters, or only a partial device target set specifying some of the device parameters. In an embodiment, the device target set may be provided by international technology roadmap for semiconductors (ITRS) or other organizations such as predictive technology model (PTM) related organizations. The device target set may also be provided by the marketing groups of the manufacturing companies of integrated circuits. For a target transistor, the device target set requires the target values of at least four parameters including saturation current (Ion), leakage current (Ioff), electrical gate oxide thickness (Toxe), and effective gate length (Leff), although a device target set including more parameters are preferred.

Figure 3A:
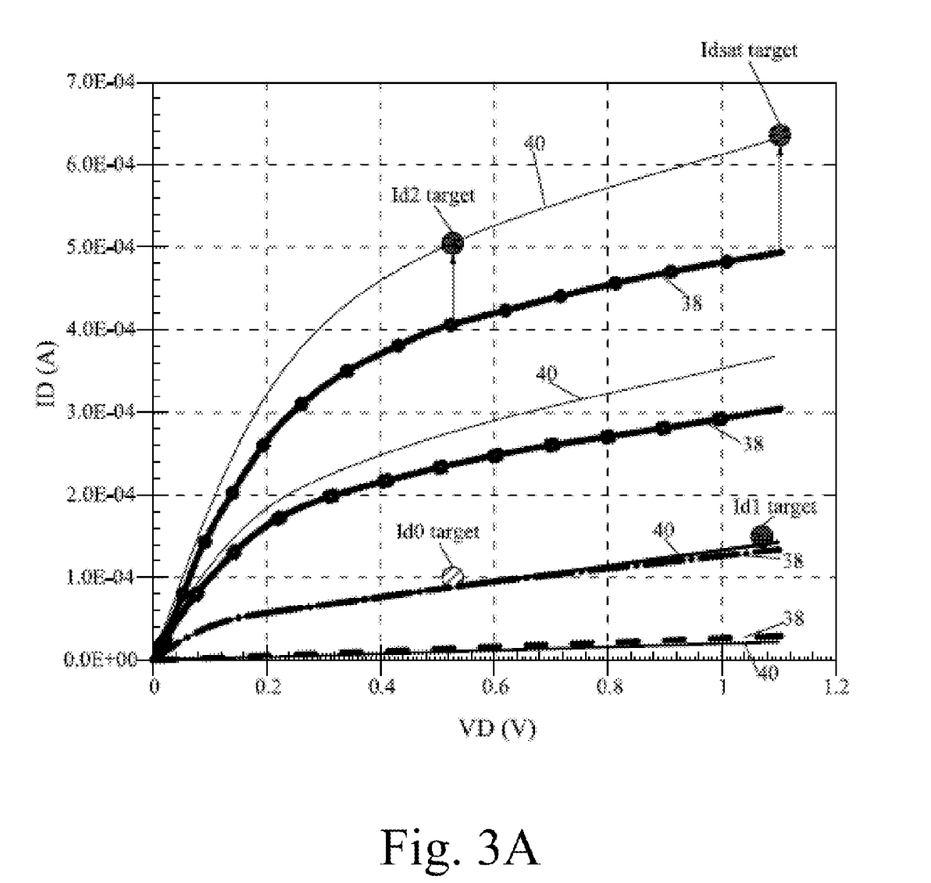
FIG. 3A illustrates warping the I-V curves obtained from the nearest known model to generate warped I-V curves, wherein the saturation current is used for the warping.

Referring to block 16 in FIG. 1, characteristic warping is performed. FIG. 3A illustrates how I-V curves are warped. The dotted lines 38 are obtained from the nearest known model, and are the same as shown in FIG. 2a. As discussed in the preceding paragraphs, the device target set includes the value of Idsat (shown as Idsat target), which is also shown in FIG. 3A. Accordingly, other characteristic currents can be calculated from the Idsat target. For example, the characteristic currents include Id2 target, which is the expected current when drain voltage VD is equal to 0.5VDD, and gate voltage VG is equal to voltage VDD. The characteristic currents may be derived since the inherent relationship between Idsat and Id2 is known from the nearest known model. Also, other characteristic currents such as Id1 target and Id0 target may also be derived from Idsat. In an embodiment, the values of Id2, Id1, and Id0 may be obtained by multiplying the corresponding values of the I-V curves of the nearest known model by certain ratios. After values of Idsat, Id2 target, Id1 target, Id0 target, and possibly other characteristic currents are known, the target I-V curves 40 (also referred to as warped I-V curves, or target I-V curves throughout the description) may be derived. These lines will reflect the expected static characteristics of the target transistor, for example, for 32 nm technology.

Figure 3B:
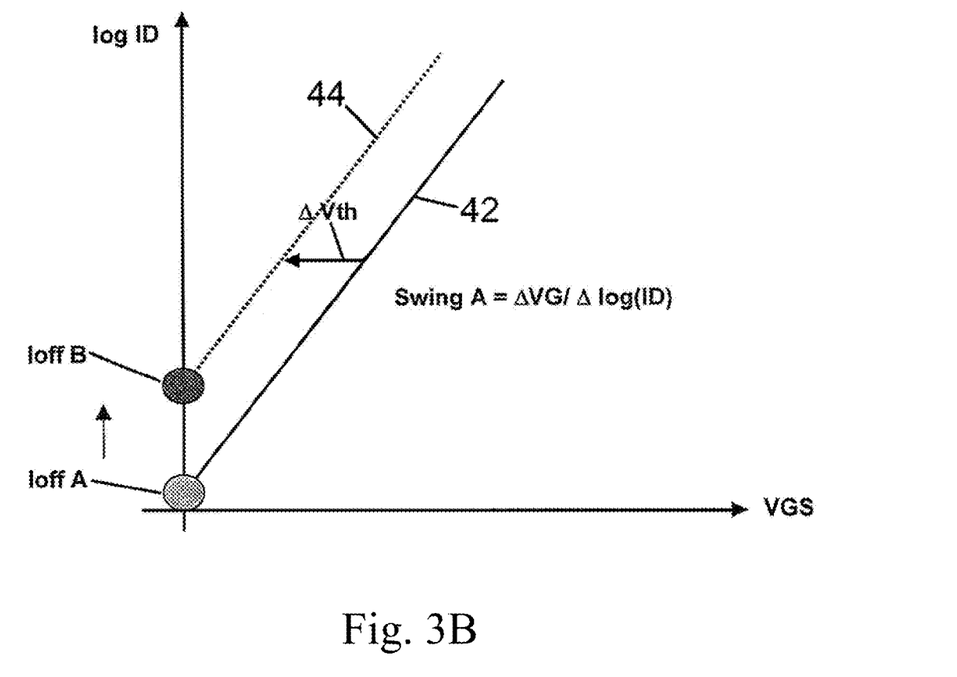
FIG. 3B illustrates a warped I-V curve generated from the nearest known model, wherein the leakage current is used for the warping.

Similarly, the target leakage current is obtained as shown in FIG. 3B. Ioff A is the leakage current obtained from the nearest known model, while Ioff B is the target leakage current, which is provided in the device target set. Line 42 is the leakage line obtained from the nearest known model. Line 44 can then be derived by drawing a line crossing Ioff B, and parallel to line 42. Line 44 will be the expected leakage characteristic of the target transistor. From FIG. 3B, the difference in threshold voltage $\Delta Vth$ between the nearest known model and the target transistor may be obtained.

Figure 3C:
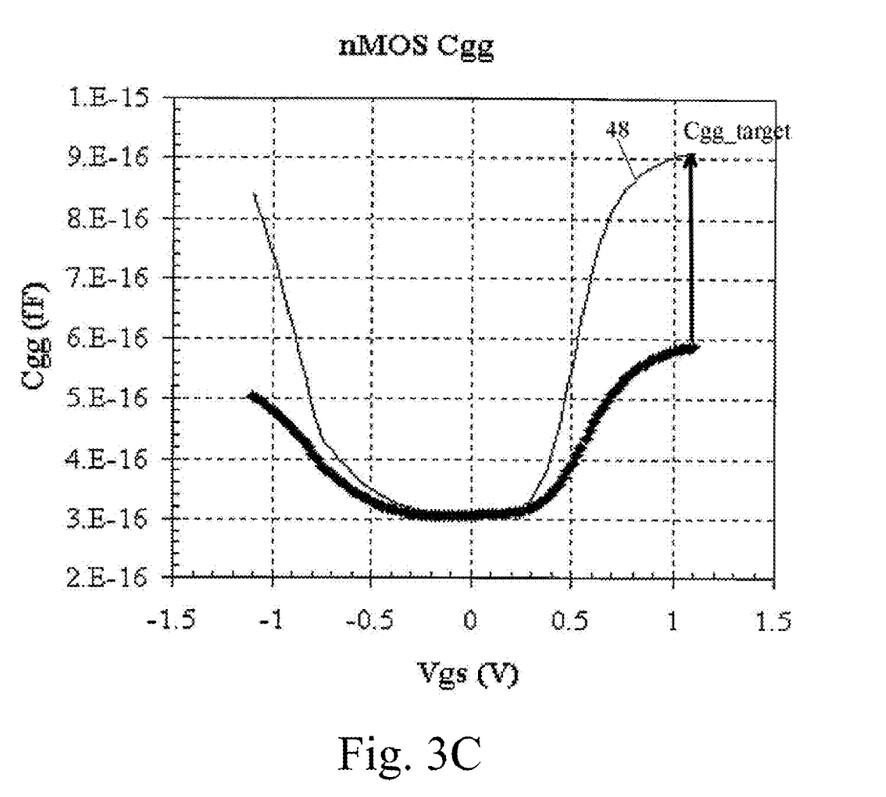
FIG. 3C illustrates warped C-V curves generated from the nearest known model.

Similarly, the dynamic characteristics of the target device may be derived, as shown by the C-V curve 48 in FIG. 3C. The details for obtaining the dynamic characteristics are essentially the same as shown in FIGS. 3A and 3B, and hence are not repeated herein. In an exemplary embodiment, the target C-V curve 48 may be derived from parameter Toxe, which is also in the device target set.

Next, the model file(s) of the nearest known model needs to be modified to generate the model file(s) for the target devices. To determine which of the parameters in the nearest known model files need to be modified, and the magnitude of the modification, a sensitivity analysis needs to be performed, as shown by step 18 in FIG. 1. For example, in FIG. 3A, dotted lines 38 represent the nearest known model. It is desirable that when the parameters in the nearest known model files are modified, the I-V curves of the transistor represented by the modified model files will fit target I-V curves 40 of the target device. Apparently, the change to the values of some of the parameters in the nearest known model files has substantially no impact to the change of I-V curves, and hence these parameters are referred to as non-sensitive parameters. On the other hand, the change to the values of some other parameters in the nearest known model files has significant impact to the changing of I-V curves and/or C-V curves, and hence these parameters are referred to as sensitive parameters. The sensitivity analysis is used to determine which of the parameters are most sensitive parameters to the change of values of the parameters in the device target set, and hence to the change of I-V curves and C-V curves. For transistors, the sensitive parameters include, but are not limited to, electrical gate oxide thickness Toxe, threshold voltage Vth0, body effect parameters k1 and k2, mobility µ0, saturation velocity Vsat, and the like.

The reason why the most sensitive parameters need to be determined may be explained as follows. In order to preserve the device physics, which are the inherent relationship between characteristics of the device, it is desirable that as few parameters as possible in the nearest known model files are changed, and the magnitude of the change is preferably as small as possible. However, if non-sensitive parameters are changed, substantially no change to the values of the target parameters in the device target set will occur (this is why these parameters are defined as being non-sensitive), and substantially no change to the I-V curves and C-V curves occurs. However, the device physics will still be distorted. Accordingly, the change of the non-sensitive parameters has the disadvantageous features of distorting the device physics without providing help for the device to achieve the desirable target I-V curves and target C-V curves. As a comparison, the modification of the sensitive parameters can preserve the device physics to the maximum, while still modifying the performance of the device to fit to the target I-V curves and target C-V curves.

Starting from the nearest known model files, by modifying the values of the sensitive parameters in the nearest known model files, new characteristic curves, such as I-V curves and C-V curves, may be generated from the modified nearest known model files. The new characteristics are compared to the respective target I-V curves 40 and target C-V curve 48 to determine the fitness. If they substantially fit with each other (the fitness value being true), then the target values of the parameters in the device target set have been achieved, and the modified nearest known model files will be used as the model files for the target device, for example, transistors of 32 nm technology. If, however, the new I-V curves and C-V curve generated from the modified nearest known model files do not fit target I-V curves 40 and C-V curve 48 (the fitness value being false), respectively, the nearest known model files need to be further modified. These modifying and comparison steps need to be performed repeatedly, until the modified nearest known model files (referred to as target model files hereinafter) correctly reflect the desirable device target set, the target I-V curves 40, and target C-V curve 48 with acceptable error margins. The process for obtaining the model files is referred to as the modeling of the target device. It is noted that modification and the fitting of the I-V curves is only an example. For the target model files to be finalized, other parameters in the device target set and other warped curves such as leakage current curve 44, as shown in FIG. 3C, also need to be fitted. When the fitting is performed, the parameters in the device target set may be assigned with weights, and those key parameters assigned with higher weight need to be fitted better than those with lower weights before the modification and fitting process is concluded. The key parameters include, but are not limited to, saturation current Idsat, leakage current Ioff, and effective current Ideff.

After the target model files for the target devices are obtained, the target model files may be used by designers to simulate device performance, for example, the transistors of 32 nm technology. Preferably, in the above-discussed modification of model files, the change to the model files needs to be kept minimum, which means a minimum number of parameters should be changed, and the magnitude of the change should be as small as possible. Accordingly, in the repeated steps of modifying the sensitive parameters to fit the target I-V curves and the target C-V curves, there may be more than one candidate solution leading to similar degrees of fitness. For example, if a ten percent change in the k1 value and a 20 percent change in the k2 value result in the same I-V curves and C-V curves, the ten percent change is preferably selected. Similarly, the one of the candidate solutions with a smaller number of changed parameters is preferably selected.

The modeling method of the present invention as described in the preceding paragraphs (referred to as sensitivity-based minimum-change modeling method, or SMC) provides capability for designers and marketing people to ask "what if," questions, for example, the questions regarding what the performance of transistors will be if the transistor has certain saturation current and certain leakage current. This significantly helps the determination of the directions of the technology evolvement and the evaluation of the potential transistor characteristics in terms of how they will perform in customer's circuits and products. Further, the modeling method does not require a comprehensive device target set. Instead, incomplete (partial) device target sets may be used to generate model files.

Advantageously, the model files, according to the embodiments of the present invention, are not limited to certain technology, a certain device and/or certain materials. For example, model files of transistors formed on bulk substrates, transistors formed on SOI substrates, transistors with polysilicon gates, transistors with high-k/metal gates, planar transistors, and FinFET transistors can all be developed using the embodiments of the present inventions. The resulting model files will inherit the special characteristics, if any, of the corresponding transistors. Also, circuits with more than one transistor, such as SRAM cells, may also use the embodiments of the present invention to generate model files.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for generating model files of target devices of an integrated circuit, the method comprising:
providing the target devices;
providing a device target set for the target devices, wherein the device target set comprises target values of parameters of the target devices;
determining a nearest known model related to the target devices, wherein the nearest known model comprises a first model file stored on a non-transitory computer-readable medium;
performing a sensitivity analysis to determine sensitive parameters in the first model file and to determine non-sensitive parameters in the first model file, wherein the non-sensitive parameters are less sensitive than the sensitive parameters in modifying characteristics of the target devices to fit the device target set;
modifying the sensitive parameters in the first model file to generate a second model file, wherein the non-sensitive parameters in the first model file are not modified; and
determining a fitness value of a circuit simulated using the second model file with values of parameters in the device target set.

2. The method of claim 1 further comprising:
generating static characteristic curves of the target devices using the first model file; and warping the static characteristic curves to generate warped static curves fitting the device target set, wherein the step of determining the fitness value using the second model file comprises:
  generating additional static characteristic curves using the second model file; and
  comparing the additional static characteristic curves with the warped static curves to determine the fitness value.

3. The method of claim 1 further comprising:
generating static dynamic characteristic curves of the target devices using the first model file; and
warping the dynamic characteristic curves to generate warped dynamic curves fitting the device target set, wherein the step of determining the fitness value using the second model file comprises:
  generating additional dynamic characteristic curves using the second model file; and
  comparing the additional dynamic characteristic curves with the warped dynamic curves to determine the fitness value.

4. The method of claim 1 further comprising repeating steps between the step of modifying the sensitive parameters and the step of determining the fitness value.

5. The method of claim 1, wherein the target devices comprise a transistor, and wherein the device target set comprises a saturation current, a leakage current, an electrical gate oxide thickness, and an effective gate length.

6. The method of claim 1, wherein the sensitive parameters are selected from the group consisting essentially of an electrical gate oxide thickness, a threshold voltage, body effect parameters k1 and k2, a mobility, a saturation velocity, and combinations thereof.

7. The method of claim 1, wherein the step of modifying the sensitive parameters in the first model file comprises finding a first candidate solution for modifying the sensitive parameters and a second candidate solution for modifying the sensitive parameters, and selecting one from the first candidate solution and the second candidate solution having a smaller number of changed sensitive parameters.

8. The method of claim 1, wherein the step of modifying the sensitive parameters in the first model file comprises finding a first candidate solution for modifying the sensitive parameters and a second candidate solution for modifying the sensitive parameters, and selecting one from the first candidate solution and the second candidate solution having a smaller magnitude of a changed one of the sensitive parameters.

9. The method of claim 1 further comprising forming an integrated circuit device based on the second model file.

10. A method for generating model files of a device for integrated circuits, the method comprising:
  providing a target transistor;
  providing a device target set for the target transistor, wherein the device target set comprises target parameter values;
  determining a list of candidate known models related to the target transistor;
  selecting a nearest known model from the list of candidate known models, wherein the nearest known model comprises a first model file stored on a non-transitory computer readable medium;
  generating I-V curves and C-V curves from the nearest known model;
  warping the I-V curves and the C-V curves to generate warped I-V curves and warped C-V curves fitting at least one of the target parameter values in the device target set;
  performing a sensitivity analysis to determine sensitive parameters in the first model file;
  modifying the sensitive parameters in the first model file to generate a second model file;
  simulating a performance of the target transistor using the second model file; and
  comparing the performance with the warped I-V curves and warped C-V curves to determine a fitness value.

11. The method of claim 10, wherein the fitness value is a "false," and wherein the method further comprises:
  modifying the sensitive parameters in the second model file to generate a third model file; and
  simulating an additional performance of the target transistor using the third model file, and comparing the additional performance with the warped I-V curves and warped C-V curves to determine an additional fitness value.

12. The method of claim 10, wherein the device target set comprises a saturation current, a leakage current, an electrical gate oxide thickness, and an effective gate length.

13. The method of claim 12, wherein the step of warping the I-V curves comprises:
  calculating characteristic currents from the saturation current in the device target set; and
  expanding the I-V curves to fit to the saturation current and the characteristic currents.

14. The method of claim 10, wherein the sensitive parameters comprise an electrical gate oxide thickness, a threshold voltage, body effect parameters k1 and k2, a mobility, and a saturation velocity.

15. The method of claim 10, wherein the target transistor is a type selected from the group consisting essentially of a transistor formed on a bulk substrate, a transistor formed on a silicon-on-insulator (SOI) substrate, a transistor with a polysilicon gate, a transistor with a metal gate, a planar transistor, and a FinFET transistor, and wherein the nearest known model is for a same type of transistor as the target transistor.

16. The method of claim 10 further comprising:
  assigning a first weight to a first parameter in the device target set;
  assigning a second weight to a second parameter in the device target set, wherein the second weight is greater than the first weight; and
  comparing the performance with the target parameter values in the device target set, wherein the fitness value is not true until the performance fits the second parameter no worse than fitting the first parameter.

17. The method of claim 16, wherein the second parameter is selected from the group consisting essentially of a saturation current, a leakage current, and an effective current.

18. The method of claim 10, wherein during the step of generating the second model file, the sensitive parameters identified in the step of performing the sensitivity analysis are modified, and non-sensitive parameters that are less sensitive than the sensitive parameters in modifying characteristics of the target devices to fit the device target set are not modified.

19. The method of claim 10 further comprising repeating steps between the step of modifying the sensitive parameters and the step of determining the fitness value.

20. The method of claim 10 further comprising forming an integrated circuit device based on the second model file.

* * * * *